United States Patent [19]

Itoh

[11] Patent Number: 5,331,241
[45] Date of Patent: Jul. 19, 1994

[54] ELECTRO-STRICTIVE ACTUATOR

[75] Inventor: Kiyoshi Itoh, Kawasaki, Japan

[73] Assignee: Fujitsu Limited, Kawasaki, Japan

[21] Appl. No.: 112,228

[22] Filed: Aug. 27, 1993

Related U.S. Application Data

[63] Continuation of Ser. No. 799,160, Nov. 27, 1991, abandoned.

[30] Foreign Application Priority Data

Nov. 30, 1990 [JP] Japan ............................ 2-130424[U]

[51] Int. Cl.$^5$ ............................................. H01L 41/08
[52] U.S. Cl. ..................................... 310/328; 310/348; 400/124
[58] Field of Search .............. 310/323, 325, 328, 334, 310/348, 363–366; 400/124

[56] References Cited

U.S. PATENT DOCUMENTS

| | | | |
|---|---|---|---|
| 3,140,859 | 7/1964 | Scarpa | 310/325 X |
| 3,427,480 | 2/1969 | Robinson | 310/325 |
| 3,518,766 | 7/1970 | Burt | 310/328 X |
| 3,891,869 | 6/1975 | Scarpa | 310/325 |
| 3,952,215 | 4/1976 | Sakitani | 310/328 |
| 4,195,243 | 3/1980 | Thaxter | 310/328 X |
| 4,217,781 | 8/1980 | Abts | 310/334 X |
| 4,220,886 | 9/1980 | Ciszewski et al. | 310/325 |
| 4,229,812 | 10/1980 | Holloway | 310/328 X |
| 4,435,666 | 3/1984 | Fukui et al. | 310/328 |
| 4,530,138 | 7/1985 | Ritter | 310/325 X |
| 4,633,120 | 12/1986 | Sato et al. | 310/328 |
| 4,703,218 | 10/1987 | Takahashi et al. | 310/348 |
| 4,764,021 | 8/1988 | Eppes | 310/325 X |
| 4,937,489 | 6/1990 | Hattori et al. | 310/328 |
| 5,126,615 | 6/1992 | Takeuchi et al. | 310/328 X |
| 5,210,455 | 5/1993 | Takeuchi et al. | 310/328 |

FOREIGN PATENT DOCUMENTS

| | | | |
|---|---|---|---|
| 0144655 | 6/1985 | European Pat. Off. | |
| 0000211 | 1/1984 | Japan | 310/353 |
| 0106983 | 4/1990 | Japan | 310/328 |
| 0018279 | 1/1991 | Japan | 310/328 |

Primary Examiner—Mark O. Budd
Attorney, Agent, or Firm—Staas & Halsey

[57] ABSTRACT

An electro-strictive actuator includes an electro-strictive element having a first surface through which a mechanical displacement is output. A mechanical member has a second surface which directly contacts the first surface so that the mechanical displacement of the electro-strictive element is output without attenuation to the mechanical member. The first surface or the second surface is provided with a ditch filled with a first adhesive to adhere the electro-strictive element to the mechanical member. A portion of the side of the electro-strictive element in the vicinity of the second surface may be additionally adhered to the second surface by a second adhesive. Deletion of adhesive in the contact between the first and second flat surfaces allows a good propagation of the mechanical displacement output from the electro-strictive element to the mechanical member, while an adequate adhesion strength is achieved by the adhesive in the ditch.

10 Claims, 6 Drawing Sheets

ELECTRO-STRICTIVE ACTUATOR

This application is a continuation of application No. 07/799,160, filed Nov. 27, 1991, now abandoned.

BACKGROUND OF THE INVENTION

1. Field of the Invention

This invention relates to an electro-strictive actuator, particularly to a structure to connect an electro-strictive element to its mechanical load.

2. Description of the Related Arts

In a printer head of a wire-dot printer, an electro-strictive element has been recently employed for actuating an impact printing wire in order to satisfy the recent trend aiming at a higher printing speed.

Figure 1:
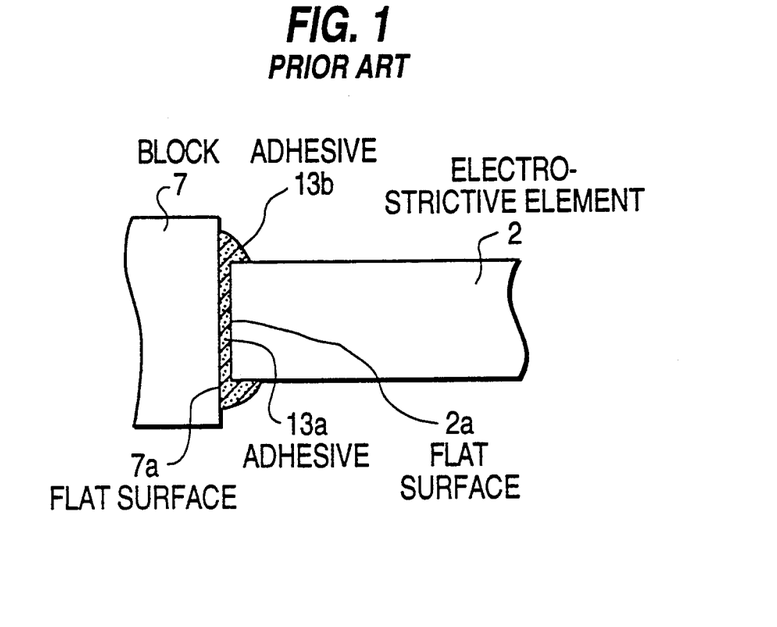
FIG. 1 schematically illustrates a cross-sectional view of a prior art connection structure of an electro-strictive element to a mechanical block to output the electro-strictive output.

In a prior art structure shown in FIG. 1 to structurally connect an electro-strictive element 2 to a metal block 7 to output a mechanical displacement caused from an electro-strictive phenomena, i.e. an expansion, of the electro-strictive element 2 to the impact printing wire, block 7 is adhered to electro-strictive element 2 by an adhesive 13a placed between a flat surface 7a of block 7 and a flat surface 2a of electro-strictive element 2, as well as by another adhesive 13b to adhere sides of electro-strictive element 2 to flat surface 7a of block 7. The mechanical displacement, i.e. mechanical output, of the electro-strictive element is typically as small as 15 $\mu$m. Adhesive 13a between two surfaces 2a and 7a is formed of an approximately 50 $\mu$m thick resin. There is a problem with the prior art structure in that the adhesive 13a, which is softer than metals and is located between metal block 7 and the electro-strictive element 2, attenuates the propagation of the displacement output from electro-strictive element 2, resulting in a decrease in the mechanical output. If the thickness of the adhesive member is reduced, the adhesion strength is reduced.

SUMMARY OF THE INVENTION

It is a general object of the invention to provide a connection structure of an electro-strictive element to a mechanical member to output a mechanical displacement of the electro-strictive element without decrease in the output displacement, while achieving an adequate bonding strength between the electro-strictive element and the mechanical member.

An electro-strictive actuator of the present invention comprises an electro-strictive element having a first surface through which a mechanical displacement is output; and a mechanical member having a second surface which directly contacts the first flat surface so that the mechanical displacement of the electro-strictive element is output without attenuation to the mechanical member, where the first or the second surface is provided with a ditch filled with a first adhesive for adhering the electro-strictive element to the mechanical member. A portion of the side of the electro-strictive element in the vicinity of the second surface may be additionally adhered to the second surface by a second adhesive.

The above-mentioned features and advantages of the present invention, together with other objects and advantages, which will become apparent, will be more fully described hereinafter, with references being made to the accompanying drawings which form a part hereof, wherein like numerals refer to like parts throughout.

DESCRIPTION OF THE PREFERRED EMBODIMENT

Figure 2:
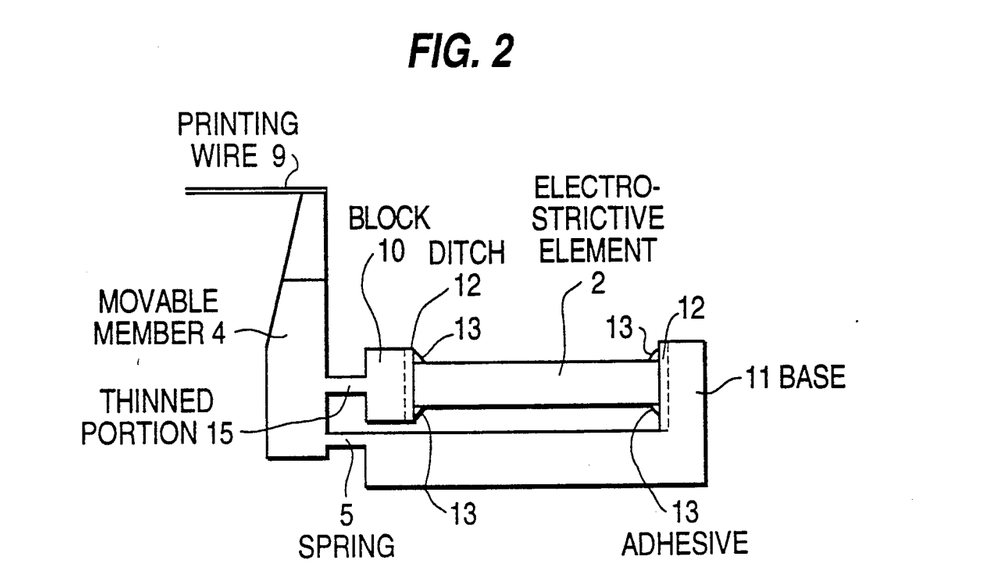
FIG. 2 schematically illustrates a cross-sectional view of an electro-strictive printing head to which the present invention may be applied.

An electro-strictive printing head which the present invention may be applied to is shown in FIG. 2, where the connection structure Is representatively shown with first preferred embodiment of the present invention which is described below .An electro-strictive element 2 is formed of a stack of a plurality of typically 3.0 mm wide$\times$2.7 mm wide$\times$0.1 mm thick sheets of piezoelectric material, typically of a composite PZT, i.e. lead-zirconium-titan oxides ceramic, and film electrodes, as widely employed, and is typically 24 mm thick in the longitudinal length of the electro-strictive element. An application of electrical voltage between the electrodes, i.e. across the piezoelectric sheets, causes a mechanical expansion along the thickness of the sheet, which is the longitudinal axis of electro-strictive element 2 shown in FIG. 2. The piezoelectric sheets and the electrodes are not individually shown in the figures. According to the structure of the present invention a longitudinal end of electro-strictive element 2 is connected to an end of a base 11 made of a metal, typically of an iron alloy having a low thermal expansion coefficient. Again, according to the structure of the present invention another longitudinal end of electro-strictive element 2 is connected to a flat part of a block 10 made of a metal. An end of a movable member 4 is held to another end of base 11 via a spring 5, which acts as a hinge . Another end of movable member 4 is fixed with a printing wire 9. A resiliently thinned portion 15 of block 10 is connected to movable member 4 at a relatively short distance from spring 5 with respect the distance between spring 5 and printing wire 9. Thus, the mechanical displacement, as small as typically 15 $\mu$m, of block 10 is amplified to as large as several hundreds, typically 300 $\mu$m stroke, of printing wire 9. By the stroke of printing wire 9, the top end of printing wire 9 strikes an ink ribbon onto a sheet held on a platen to print a dot on the sheet. The ribbon, the sheet and the platen are not shown in the figure.

Figure 3A:
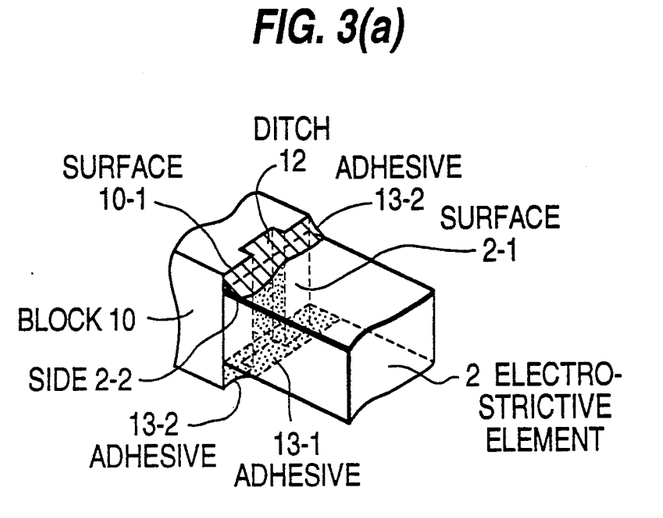
FIGS. 3(a) and 3(b) schematically illustrate a first preferred embodiment of the connection structure of the present invention

A first preferred embodiment of connection structure of the present invention is shown in FIGS. 3(a) and 3(b). In FIG. 3(a), a flat surface 10-1 of block 10 directly contacts a flat surface 2-1 of electro-strictive element 2 without having adhesive therebetween. Surface 10-1 is provided with a ditch 12, for example, 0.2 mm deep, and, for example, 1 mm wide. An adhesive 13-1, for example a widely employed epoxy resin, is filled in ditch 12 so that block 10 and electro-strictive element 2 are adhered to each other. Additionally, portions 2-2 of the sides of electro-strictive element 2 in the vicinity of block 10 are provided with adhesive 13-2 so as to enhance the bonding strength between block 10 and electro-strictive element 2. Adhesive 13-1 in ditch 12 having a 3 mm² area, allows 6 to 9 kg bonding strength, which is adequate to reliably connect block 10 and electro-strictive element 2. Thus, adhesive 13-2 on sides of electro-strictive element 2 is supplemental to adhesive 13-1 in ditch 12.

Figure 3B:
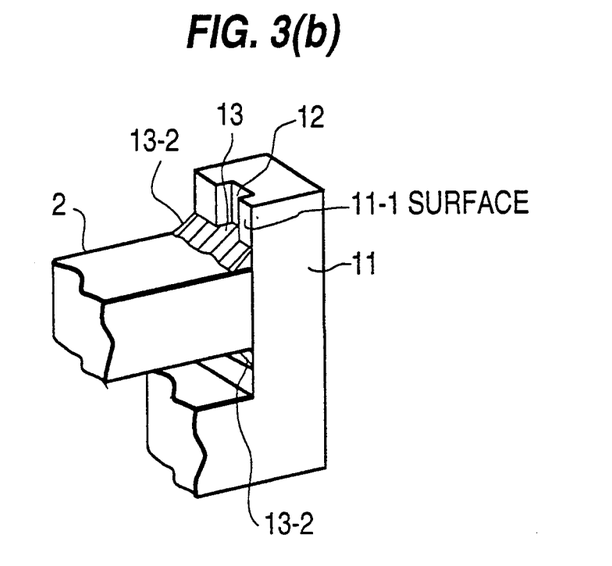

FIG. 3(b) shows the connection structure between electro-strictive element 2 and base 11, where the same connection structures as that of FIG. 3(a) is employed, accordingly, the same numerals are given to designate the same parts.

Due to the direct contact between electro-strictive element 2 and block 10/base 11, the displacement output from electro-strictive element 2 is propagated to block 10/base 11 without attenuation.

Figure 4A:
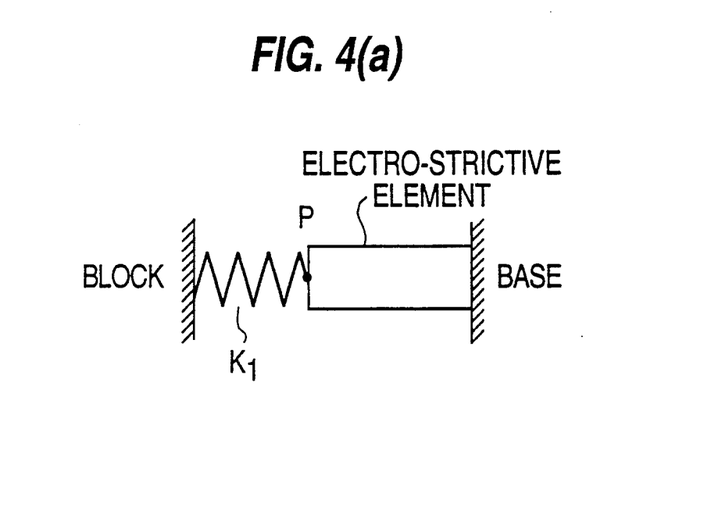
FIGS. 4(a) and 4(b) are diagrams of equivalent circuits for the cases with and without an adhesive between the two contacting surfaces.
Figure 4B:
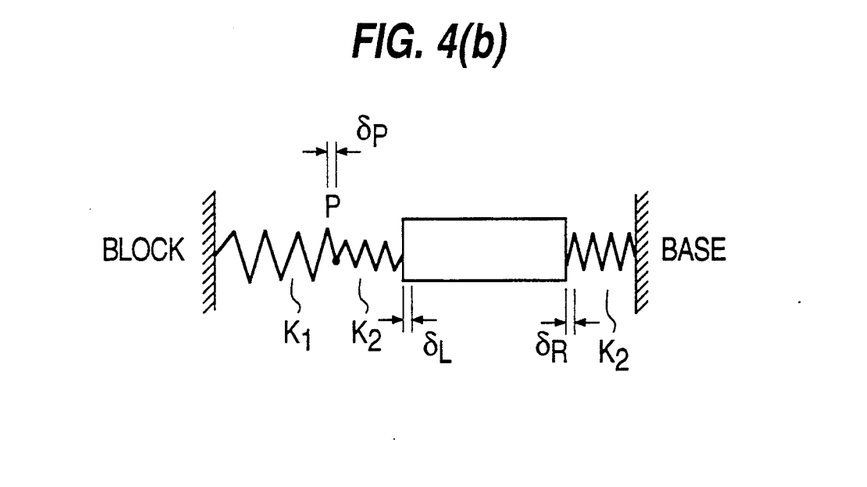

The effect of the deletion of the adhesive between the two flat surfaces of electro-strictive element 2 and block 10/base 11 is evaluated as follows. FIG. 4(a) shows a modeled equivalent circuit having no adhesive between the two contacting surfaces. FIG. 4(b) shows a modeled equivalent circuit having the adhesive between the two contacting surfaces. In FIG. 4(a), the base drawn at the right hand side is considered to have an infinite spring constant, that is, the base is considered not to move at all. Accordingly, the expansion δ of the electro-strictive element is 100% output from point P at the left hand side of the element to the block having a spring constant $K_1$. In FIG. 4(b), $K_2$ indicates a spring constant of the adhesive, and δ and δ indicate the displacements at the left and right ends of electro-strictive element, respectively. Then, $$\delta = \delta_L + \delta_R \quad (1)$$

$$K_L \delta_L = K_2 \delta_R \quad (2)$$

where: $K_L = K_1 K_2 / (K_1 + H_2)$ therefore, from equations (1) and (2)

$$\delta_L = \delta \cdot K_2 / (K_L + K_2) \quad (3)$$

and, $$K_L \delta_L = K_1 \delta_P \quad (4)$$

therefore, from equations (4), (3) and (6)

$$\delta_P = \delta_L \cdot K_L / K_1 = ((k_2/(K_1 + K_2))((K_2/(K_L + K_2)) \quad (5)$$

practical values are:
$K_1 = 150$ kgf/mm
$K_2 = 8.1 \times 10^3$ kgf/mm
for the ease where the adhesive is 0.1 mm thick, and has Young module: 300 kgf/mm² and adhesion area 2.7 mm × 3 mm;

therefore, by substituting the practical values to equation (5), $$\delta_P = 0.964 \, \delta$$

Thus, approximately 4% decrease in the output displacement is recovered by the deletion of the adhesive between the two contacting faces, at each end of electro-strictive element.

Figure 5A:
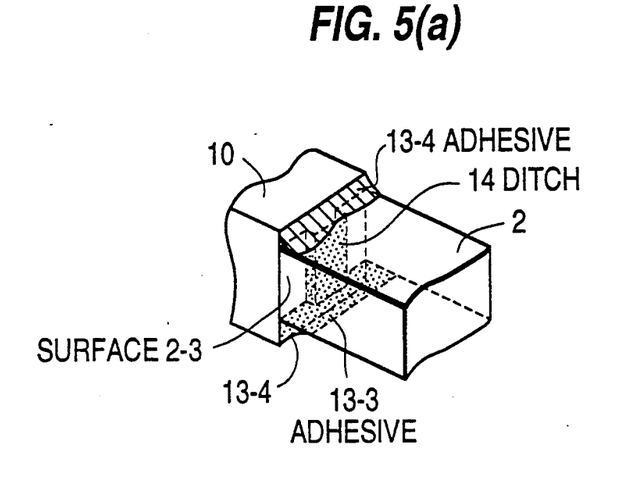
FIGS. 5(a) and 5(b) schematically illustrate a second preferred embodiment of the connection structure of the present invention.
Figure 5B:
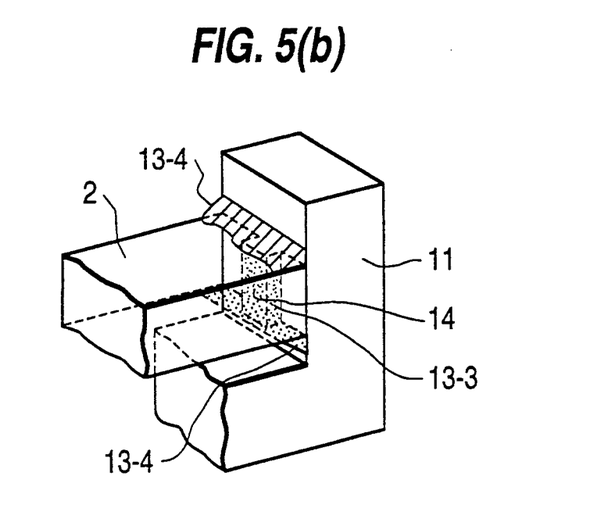

A second preferred embodiment of the connection structure of the present invention is shown in FIGS. 5(a) and 5(b) where a ditch 14 is provided on a surface 2-3 of electro-strictive element 2, while block 10 and base 11 have no ditch thereon. An adhesive 13-3 is filled in ditch 14 and supplemental adhesive 13-4 is provided on portions of the sides of electro-strictive element 2 in the vicinity of block 10 and base 11. The same advantageous effect as the first preferred embodiment is accomplished in the second preferred embodiment.

Though in the above preferred embodiments the supplemental adhesive 13-2 or 13-4 is provided along the two facing sides where ditch 12 or 14 is seen, it is apparent that the adhesive may be provided along the other two sides of electro-strictive element 2, or moreover all around the four sides.

Figure 6A:
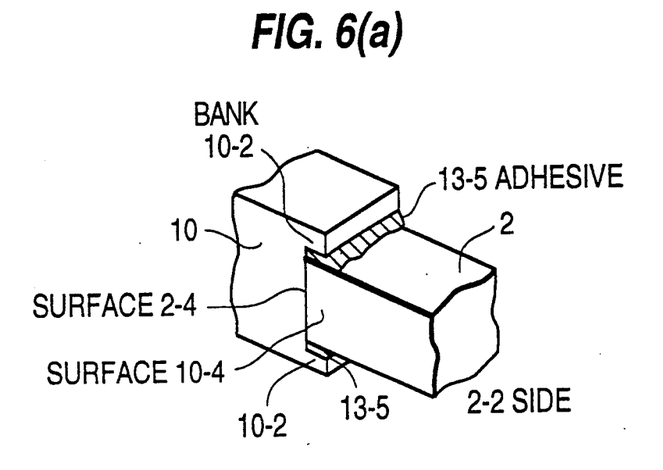
FIGS. 6(a) and 6(b) schematically illustrate a third preferred embodiment of the connection structure of the present invention.
Figure 6B:
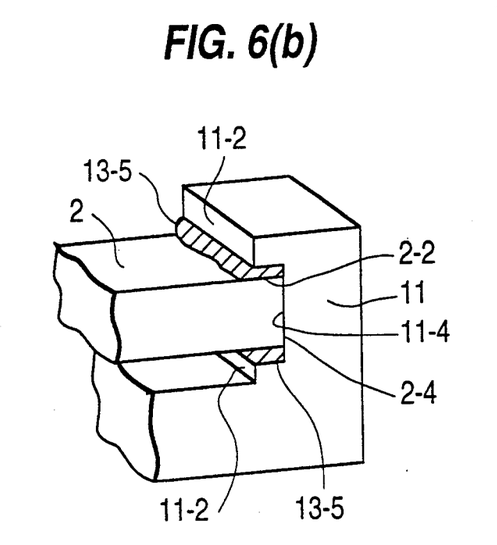

A third preferred embodiment of the connection structure of the present invention is shown in FIGS. 6(a) and 6(b) where no ditch is provided on the electro-strictive element 2, the block 10 and the base 11 but gaps are provided between end sides of electro-strictive element 2 and banks 10-2, 11-2, protruding from surfaces 10-4 of block 10 and surface 11-4 of base 11, respectively. The gaps are typically 50 to 100 μm and 1 to 2 mm deep, filled with adhesive material 13-5 so that electro-strictive element 2 is adhered to block 10 and base 11. Surfaces 2-4 of electro-strictive element 2 directly contact the opposite surfaces 10-4 and 11-4, respectively, without adhesive therebetween. Therefore, the direct contact of the surfaces having no ditch allows a good propagation of the mechanical output of the electro-strictive element therethrough, while an adequate bonding force is achieved therebetween.

Though in the third preferred embodiment the adhesive is provided along the two facing sides of electro-strictive element, it is apparent that the banks and adhesive may be provided along the other two sides of electro-strictive element 2, or moreover all around the four sides.

Figure 7A:
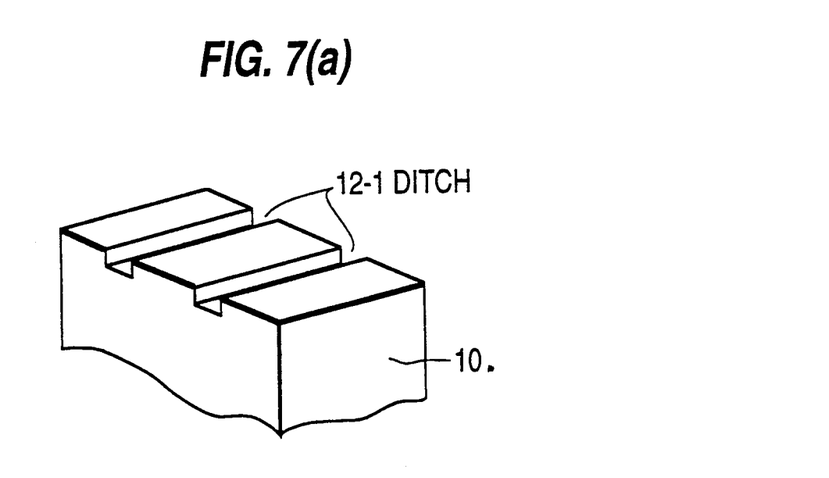
FIGS. 7(a) and 7(b) schematically Illustrate a fourth preferred embodiment of the connection structure of the present invention.
Figure 7B:
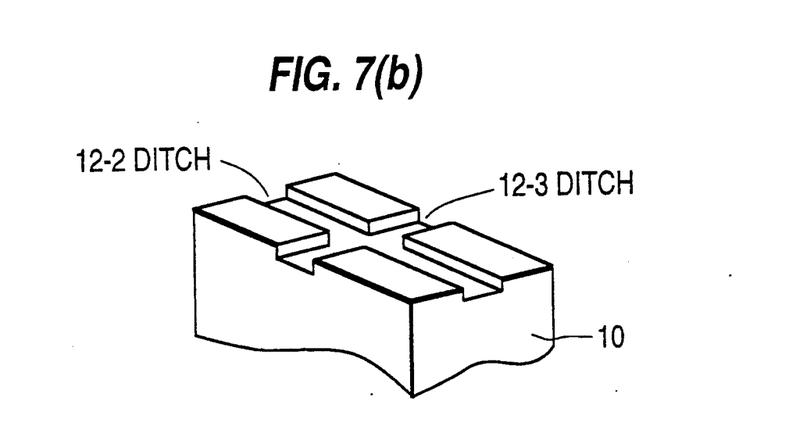

Variations of the ditch are shown in FIGS. 7(a) and 7(b) as a fourth preferred embodiment of the present invention. FIG. 7(a) shows two ditches arranged in parallel. FIG. 7(b) shows two ditches arranged crosswise. These structures provide more bonding strength between the electro-strictive element and the block/base. It is apparent that the location and size of the ditch can be arbitrarily determined and can be other than those disclosed in the above preferred embodiment depending on the design requirement.

The many features and advantages of the invention are apparent from the detailed specification and thus, it is intended by the appended claims to cover all such features and advantages of the invention which fall within the true spirit and scope of the invention. Further, since numerous modifications and changes will readily occur to those skilled in the art, it is not desired to limit the invention and accordingly, all suitable modifications are equivalents may be resorted to, falling within the scope of the invention.

What is claim is:
1. An impact-type dot-matrix printer head comprising:

a printing wire having a first end facing a sheet surface to strike and print the sheet surface, and having a second end;

an arm having a first end for supporting and moving the second end of said printing wire towards the sheet surface, said arm being rotatable about a supporting point provided on a second end of said arm, which is opposite the first end of said arm;

an electro-strictive element positioned adjacent said arm, said electro-strictive element expanding along a longitudinal direction in response to a driving voltage so as to contact said arm, said electro-strictive element having a first surface at a first longitudinal end thereof and having a second surface at a second longitudinal end thereof;

a mechanical member connecting said electro-strictive element to said arm at a position between the first and second ends of said arm and adjacent said supporting point, said mechanical member being adhered to said electro-strictive element and including a third surface in direct contact with said first surface; and frame means for supporting said arm by said supporting point and adhering the second longitudinal end of said electro-strictive element, said frame means including a fourth surface in direct contact with said second surface.

2. An impact-type dot-matrix printer head as set forth in claim 1, wherein said third surface has a ditch, and further comprising a first adhesive member filled in said ditch, for adhering said electro-strictive element to said mechanical member.

3. An impact-type dot-matrix printer head as set forth in claim 2, further comprising:

second adhesive member for adhering said third surface to a side of said electro-strictive element, said side being substantially orthogonal to said first surface.

4. An impact-type dot-matrix printer head as set forth in claim 3, wherein said electro-strictive element has a plurality of sides substantially orthogonal to said first surface, and wherein a plurality of said second adhesive members are provided for adhering said plurality of said sides to said third surface.

5. An impact-type dot-matrix printer head as set forth in claim 1, wherein said first surface has a ditch, and further comprising an adhesive member filled in said ditch, for a adhering said electro-strictive element to said mechanical member.

6. An impact-type dot-matrix printer head as set forth in claim 5, further comprising a second adhesive member for adhering said third surface to a side of said electro-strictive element, said side being substantially orthogonal to said first surface.

7. An impact-type dot-matrix printer head as set forth in claim 6, wherein said electro-strictive element has a plurality of sides substantially orthogonal to said first surface, and wherein a plurality of said second adhesive members are provided for adhering said plurality of said sides to said third surface.

8. An impact-type dot-matrix printer head as set forth in claim 1, wherein said electro-strictive element has an outer side substantially orthogonal to said first surface, and further comprising:

a plurality of banks protruding from said third surface, so that a gap is provided between one of said banks and said outer side of said electro-strictive element; and an adhesive member filled in said gap, for adhering said outer side of said electro-strictive element to said bank.

9. An impact-type dot-matrix printer head as set forth in claim 1, wherein said first and third surfaces have first portions which are in direct contact and second portions which are out of direct contact, and further comprising:

a first adhesive member between said second portions of said first and third surfaces to adhere said electro-strictive element to said mechanical member; and a second adhesive member for adhering said third surface to a side of said electro-strictive element, said side being substantially orthogonal to said first surface.

10. An impact-type dot-matrix printer head as set forth in claim 1, wherein said electro-strictive element has an outer side, wherein said mechanical member has an outer side, wherein said third surface of said mechanical member has at least portions thereof in direct contact with at least portions of said surface, wherein at least one of said electro-strictive element and said mechanical member have a plurality of banks protruding therefrom, so that a gap is formed between said banks and said outer side of the other of said electro-strictive element and said mechanical member, said impact-type dot-matrix printer head further comprising an adhesive in the gap to adhere said outer side to said bank.

* * * * *

UNITED STATES PATENT AND TRADEMARK OFFICE
CERTIFICATE OF CORRECTION

PATENT NO. : 5,331,241
DATED : JULY 19, 1994
INVENTOR(S) : Kiyoshi ITOH

It is certified that error appears in the above-indentified patent and that said Letters Patent is hereby corrected as shown below:

Col. 2, line 12, "invention" should be --invention;--.

Col. 3, line 47, "$(K_1+H_2)$" should be --$(K_1+K_2)$--;
line 61, "ease" should be --case--.

Col. 4, line 25, "11" should be --11,--;
line 27, "surfaces" should be --surface--.

Col. 5, line 48, "a adhering" should be --adhering--.

Signed and Sealed this

Thirty-first Day of January, 1995

Attest:

BRUCE LEHMAN

*Attesting Officer*  *Commissioner of Patents and Trademarks*